United States Patent
Desrochers et al.

Patent Number: 5,271,148
Date of Patent: Dec. 21, 1993

[54] METHOD OF PRODUCING A LEADFRAME

[75] Inventors: Alphee J. Desrochers, Sunnyvale; Gary R. Hamming, Cupertino, both of Calif.

[73] Assignee: National Semiconductor Corporation, Santa Clara, Calif.

[21] Appl. No.: 949,323

[22] Filed: Nov. 5, 1992

Related U.S. Application Data

[60] Continuation of Ser. No. 665,398, Mar. 6, 1991, abandoned, which is a division of Ser. No. 272,582, Nov. 17, 1988, abandoned.

[51] Int. Cl.⁵ .................................................. H01R 43/16
[52] U.S. Cl. .................................................. 29/827
[58] Field of Search ............... 29/33 A, 527.4, 527.6, 29/827, 838, 841, 848, 853; 72/427; 51/298, 320, 321; 264/272.15, 272.16, 272.17; 357/67, 70

[56] References Cited

U.S. PATENT DOCUMENTS

| | | | |
|---|---|---|---|
| 4,490,902 | 1/1985 | Eytcheson et al. | 29/827 X |
| 4,627,159 | 12/1986 | Waldner | 72/427 X |
| 4,633,583 | 1/1987 | Kato | 29/827 |
| 4,942,455 | 7/1990 | Shinohara | 357/70 |

FOREIGN PATENT DOCUMENTS

| | | |
|---|---|---|
| 55-71047 | 5/1980 | Japan. |
| 0150264 | 11/1980 | Japan. |
| 0029355 | 3/1981 | Japan. |
| 0150458 | 8/1984 | Japan. |
| 0150459 | 8/1984 | Japan. |
| 0169162 | 9/1984 | Japan. |
| 0161646 | 8/1985 | Japan. |
| 0208849 | 10/1985 | Japan. |
| 0008960 | 1/1986 | Japan. |
| 0135146 | 6/1986 | Japan. |
| 0128163 | 6/1987 | Japan. |
| 0156844 | 7/1987 | Japan. |
| 0200749 | 9/1987 | Japan. |
| 0107052 | 5/1988 | Japan. |
| 0131557 | 6/1988 | Japan. |
| 0131558 | 6/1988 | Japan. |
| 0168043 | 7/1988 | Japan. |
| 0228656 | 9/1988 | Japan. |
| 0237452 | 10/1988 | Japan. |

*Primary Examiner*—Mark Rosenbaum
*Assistant Examiner*—Peter Dungba Vo
*Attorney, Agent, or Firm*—Townsend and Townsend Khourie and Crew

[57] ABSTRACT

A leadframe includes a dambar separated from the to be formed molded package edge by temporary slugs. The temporary slugs are partially stamped through the thickness of the leadframe and are then pushed back into position. During encapsulation, unwanted encapsulation or flash flow is prevented from flowing farther than the closest edge of the temporary slugs. In a subsequent operation, the dambar and slugs are punched away in a single operation.

7 Claims, 5 Drawing Sheets

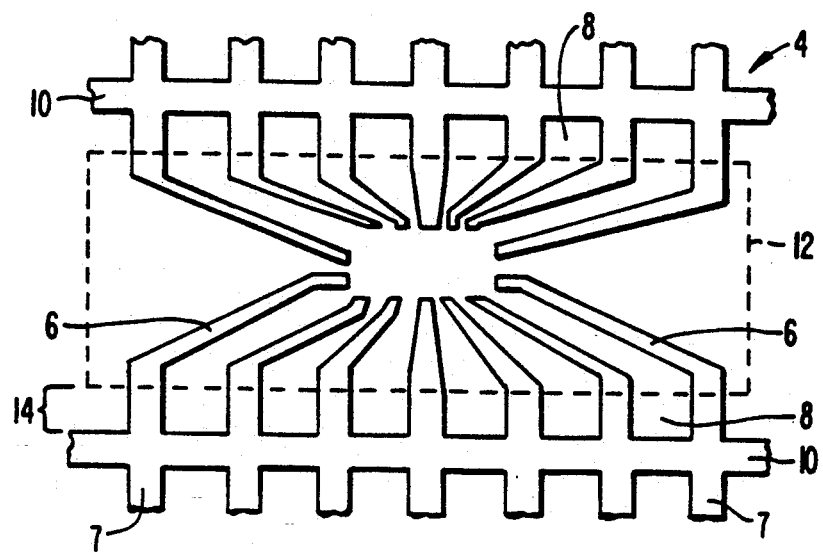
FIG._1A. (PRIOR ART)
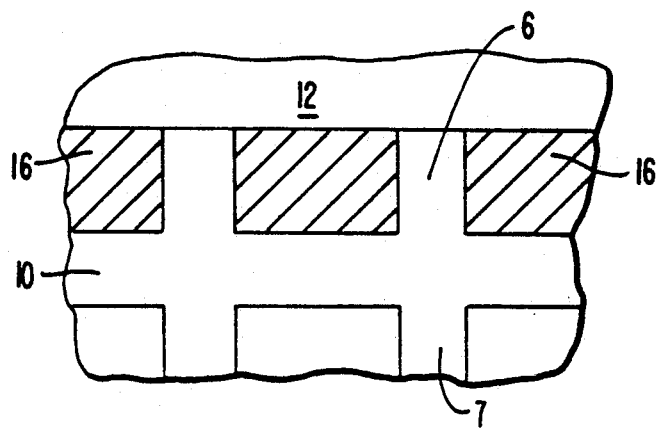
FIG._1B. (PRIOR ART)
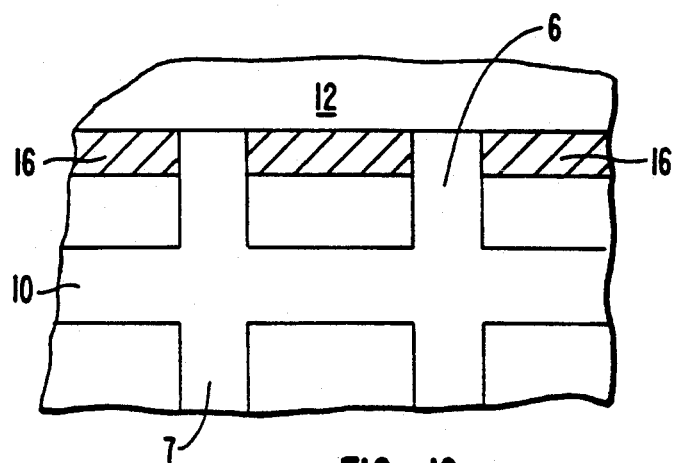
FIG._1C. (PRIOR ART)

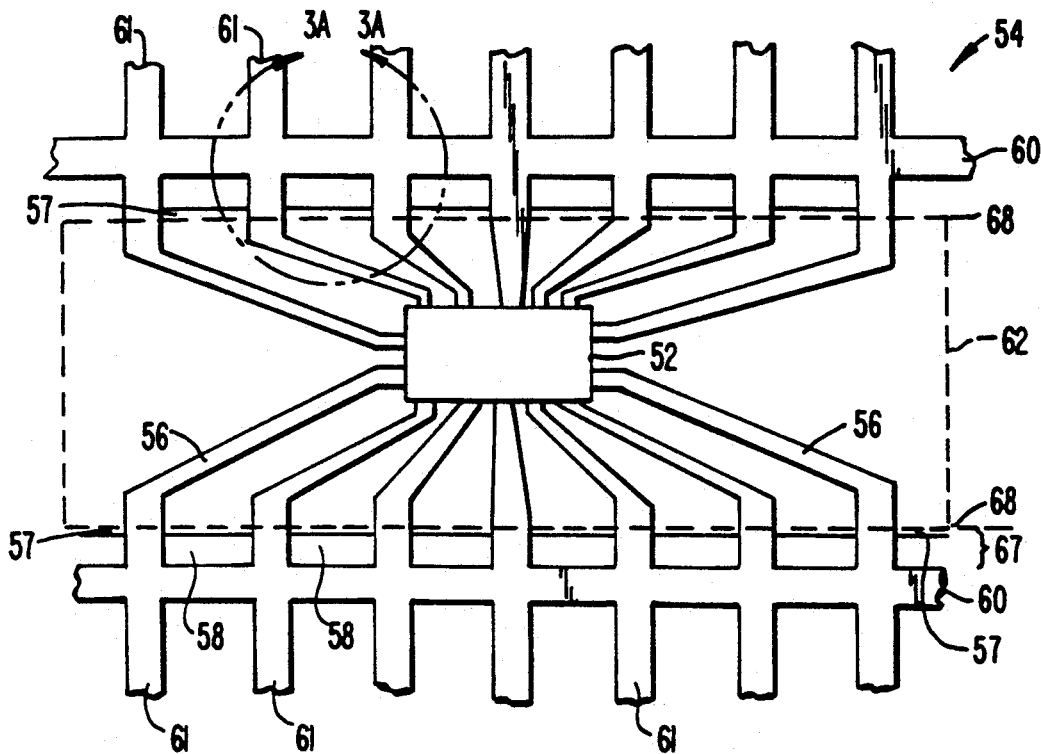
FIG._2.

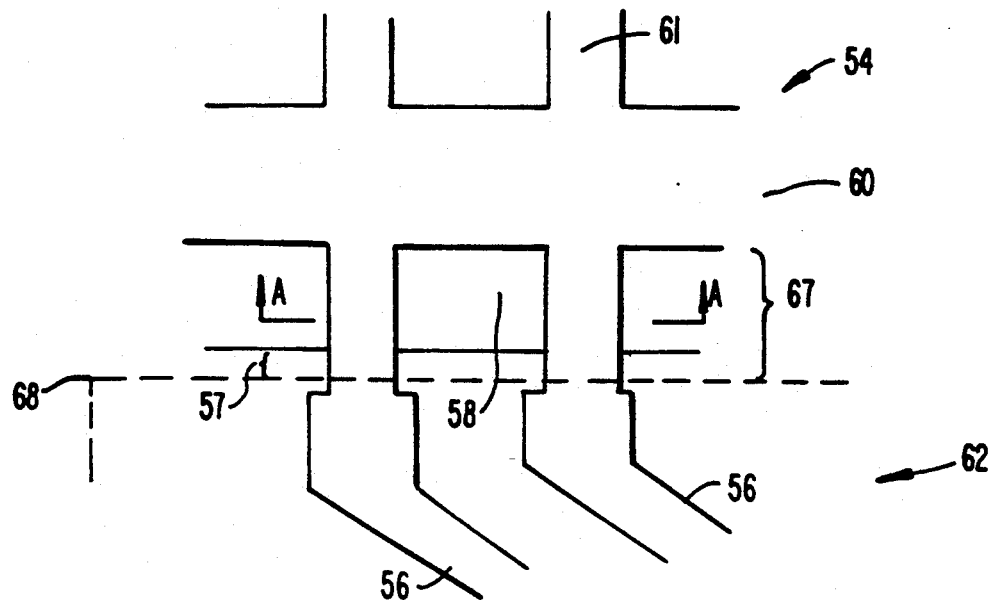
FIG._3A.
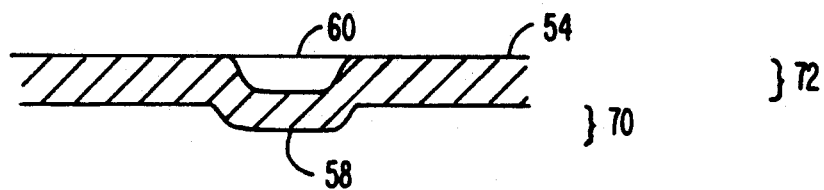
FIG._3B.
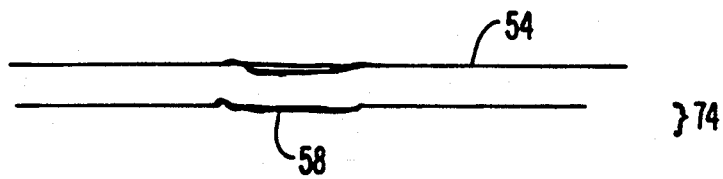
FIG._3C.

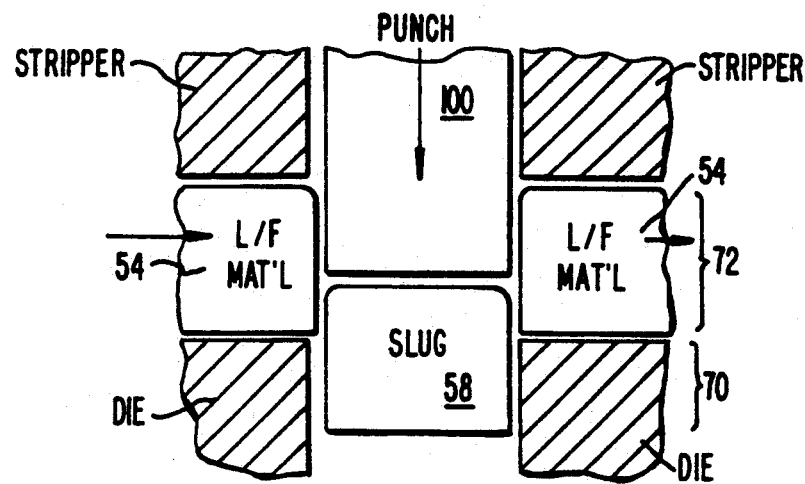
FIG._4A.
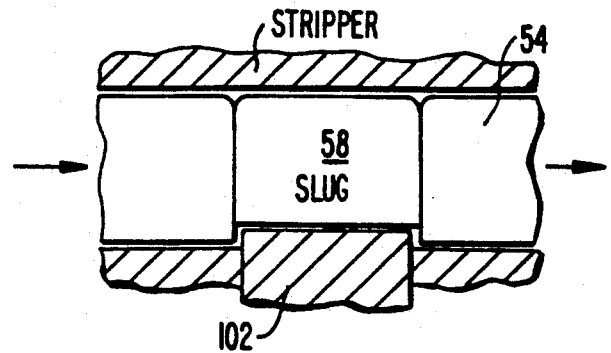
FIG._4B.
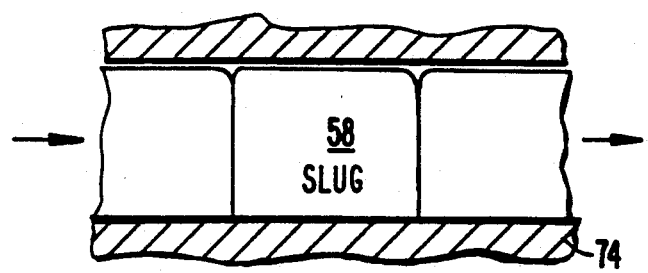
FIG._4C.

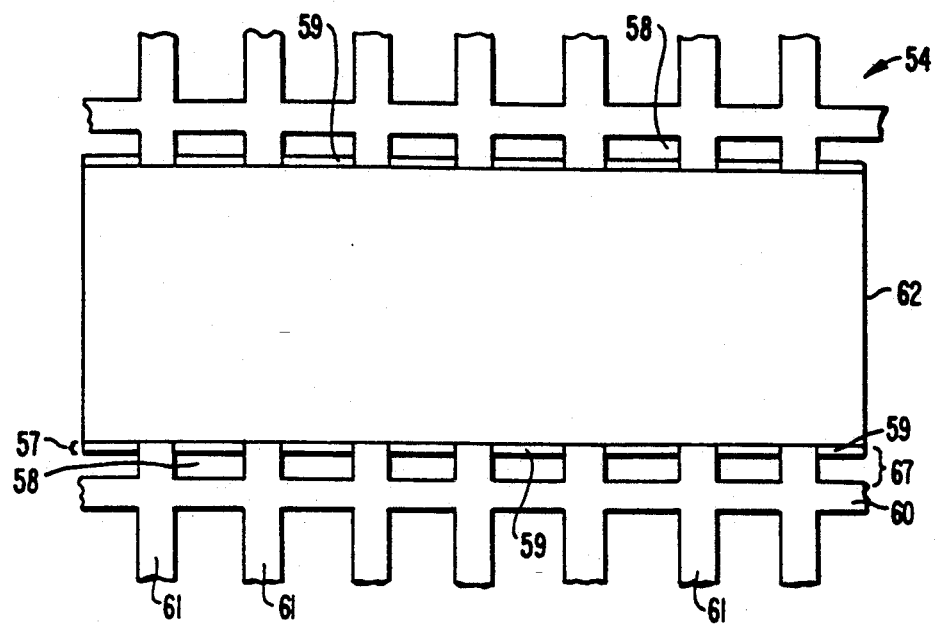
FIG._5.
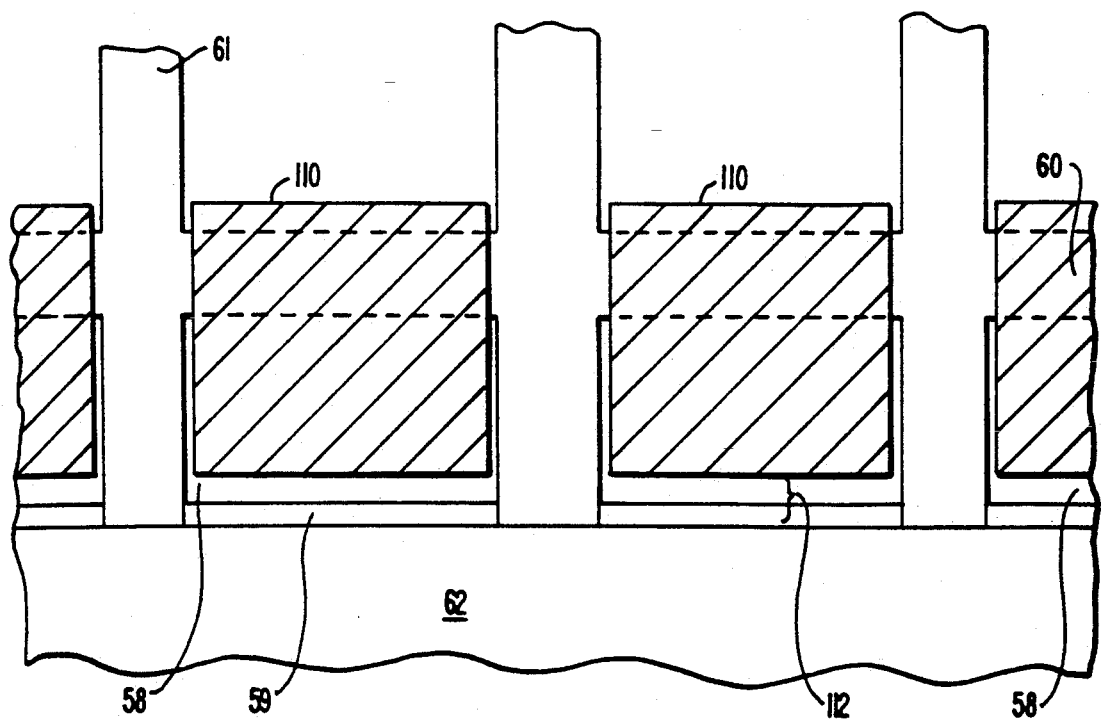
FIG._6.

METHOD OF PRODUCING A LEADFRAME

This a continuation of application Ser. No. 07/665,398, filed Mar. 6, 1991, now abandoned, which is a division of application Ser. No. 07/272,582 filed Nov. 17, 1988, now abandoned.

BACKGROUND OF THE INVENTION

1. Field of the Invention

The invention relates to encapsulating electronic components or circuits, and in particular to encapsulating integrated circuits.

2. Description of the Prior Art

Several techniques for encapsulation of integrated circuits are known in the art. In one well known process a leadframe is fabricated from a thin copper sheet, a circuit chip or die is attached, and the leadframe and chip are encapsulated in a molded package. In the molding step, a hollow mold pattern is clamped around the chip from the upper and lower surface of the leadframe, and the mold is filled with molding compound, or encapsulation, to create the package body. Unfortunately, during the molding step, the encapsulating material oozes out of the mold joint into the region between the leads. This extra encapsulant, or "flash," is undesirable because it can later flake off and jam equipment used to insert the completed integrated circuit package into printed circuit boards. The flash also can prevent the completed package from fitting into a socket or, in the case of a surface mount package, can interfere with bonding the encapsulated package to a circuit board.

One solution to the flash problem has been to punch rectangular holes in the leadframe to create a barrier strip or "dambar" in the copper leadframe well outside the package. During encapsulation, the extra encapsulant fills the holes between the package body and the dambar and goes no further. After encapsulation, the extruded flash is punched away with a "deflash" punch, and in a subsequent operation, the copper dambar is removed, usually by punching. The resultant package, however, typically still has residual portions of flash extending as much as 20 mils.

Because the encapsulating material is abrasive, the deflash punch must be replaced frequently, typically every 50,000 operations. In practice, this can mean halting the assembly process as often as three times per day to replace a worn-out punch head.

A further disadvantage of the deflash punch is that because production tolerances vary, the deflash punch head is not allowed to come closer than about 5 mils to the edge of the encapsulated package. Less separation, under worst case conditions, can result in the deflash punch head striking the encapsulated package. Even with a 5 mil separation distance, however, deflashing can fracture the package because the flash is integral to the package and adheres well to the leadframe material. Package fracture during deflash punching decreases yield at the worst possible time, when the product is nearly completed.

The prior art described above is illustrated in FIG. 1. FIG. 1A shows an integrated circuit leadframe 4 prior to encapsulation. The outline of the packaged body 12 (not yet molded) is shown in phantom. Leadframe 4 has a number of leads 6 which are connected to an integrated circuit which will be disposed in the center. Leads 6 extend outward to become pins 7 for the ultimately packaged product. Leadframe 4 has holes 8 between adjacent leads 6, which are defined by a dambar strip 10, a distance 14 from the package edge. Typically distance 14 is 15-20 mils, while dambar 10 is about 15-20 mils wide.

During encapsulation, body 12 is formed by molding an encapsulant about the leadframe 4, totally covering the integrated circuit chip. FIG. 1B is an expanded view of a portion of FIG. 1A after molding the package 12. As shown in FIG. 1B, unwanted flash 16, much thinner than the package body 12, fills holes between the sides of package 12 and the dambar 10. On one hand, if it is desired to have minimal flash extending from the finished package, dambar 10 should be located a very small distance from edge of package 12. On the other hand, however, too small a distance 14 requires the deflash punch to come very close to the package while removing the flash, thereby increasing the likelihood of fracturing the package.

As shown in FIG. 1C, during the next manufacturing step the flash 16 is punched away with a deflash punch, leaving only a small portion 16 protruding from the package. In a subsequent step, the dambar 10 is punched away to electrically isolate the pins leaving a completed package.

SUMMARY OF THE INVENTION

The present invention provides a leadframe and a method of preparing a leadframe and encapsulating an integrated circuit on the leadframe which is capable of substantially reducing unwanted flash, while minimizing the likelihood of fracturing the package during the manufacturing process. The present method uses the same high speed progression leadframe stamping die that is used in the prior art.

Instead of punching out openings to create a dambar relatively distant from the package edge, and permitting excess molding compound, or encapsulate, to flow into and fill the rectangular openings, the present invention provides a removable extension of the dambar. Where openings were provided in the prior art, the present invention provides temporary extensions of the dambar in the form of scored slugs which extend closely proximate the package edge to be formed. The slugs fill the void that would otherwise be present and prevent molding compound from flowing beyond the portion of the slugs closest to the package edge.

In the preferred embodiment our method partially stamps slugs in the leadframe located between the package leads, the package edge and the dambar. During slug formation, the leadframe material in the location of the desired slugs is urged approximately 75% of the way through the thickness of the leadframe material. In the next manufacturing step, the slugs are urged back into their original position, i.e., substantially flush with the remainder of the leadframe material. As a result, the slugs remain wedged in the leadframe material but are scored, and therefore only flimsily attached to the leadframe so they may be readily removed in a later step.

After the slugs have been created, the assembly process continues a conventional manner. During the encapsulation process, the slugs prevent molding compound from flowing beyond the portion of the slugs closest to the package edge. As a result, only a very small bit of a flash extends from the encapsulated package edges.

After encapsulation, a deflash punch simultaneously cuts the dambar and pushes the slugs out of the leadframe, breaking away any flash that may have bled onto the portion of the slug nearest the package edge. In a preferred embodiment, the deflash punch operates from the burr side of the leadframe towards the non-burr side to better remove any flash. The slugs are readily pushed out because the connections between the slugs and the leadframe material were greatly weakened when the slugs were formed. Because the slugs are so readily removable, the deflash punch need not come particularly close to the package side to remove the entire slug.

The ability to readily punch out the slug from a relatively safe distance from the package edge greatly reduces the likelihood of package fracture. Also, wear on the deflash punch is minimized because the slug is easily removed. As a result, the deflash punch lasts 5 to 10 times longer than in the prior art. Furthermore, the speed of manufacturing is increased because the dambar and slug are removed in a single operation. Finally, because the likelihood of fracture is reduced, production yield of the finished encapsulated package increases.

BRIEF DESCRIPTION OF THE DRAWINGS

FIG. 1A depicts a prior art leadframe;

FIG. 1B illustrates a portion of the leadframe of FIG. 1A after encapsulation;

FIG. 1C illustrates the prior art package shown in FIG. 1B after deflashing;

FIG. 2 is a plan view of an integrated circuit chip and leadframe fabricated according to the present invention;

FIG. 3A is a plan view of a portion of a slug and the leadframe shown in FIG. 2;

FIG. 3B is a side view of FIG. 3A along section A—A;

FIG. 3C shows the slug of FIG. 3B after the further step of pushing the slug substantially back into its original position;

FIG. 4A is a side view of the initial partial slug stamping process;

FIG. 4B is a side view of a slug being forced back into the leadframe plane;

FIG. 4C is a side view of the slug shown in FIG. 4B after completion of the slug forming process;

FIG. 5 is a plan view of the leadframe of FIG. 2 after encapsulation; and

FIG. 6 is an enlarged view of a portion of FIG. 5, showing the position of the punch heads.

DETAILED DESCRIPTION OF THE PREFERRED EMBODIMENTS

FIG. 2 shows an integrated circuit chip 52 attached to a leadframe 54 prior to encapsulation. The leadframe 54 includes pins 61, leads 56 and dambars 60. Leads 56 which make electrical connection to an integrated circuit 52. Leadframe 54 also includes rectangular-shaped slugs 58 which are urged down or partially stamped typically approximately 75% of the thickness of the material of leadframe 54. Normally leadframe 54 is stamped from 6-10 mil thick copper sheet. Thus, in a 10-mil sheet, slugs 58 are stamped down about 7.5 mils.

A dambar 60 is defined beyond slugs 58 and is a distance 67 away from the edge 68 of the package to be molded. In a preferred embodiment, distance 67 is about 15 mils, but depends upon the configuration of the package to be encapsulated. The width 61 of dambar 60 is about 15-20 mils for a small outline package. As shown in FIG. 2, the nearest edge of the slugs 58 is a distance 57 from what will be the package edge 68. Distance 57 is nominally 3 mils per side, or 6 mils worst case. Spacing of the slugs from the package assures that no portion of the slugs 58 is encapsulated within the package 62 due to dimension tolerances or slight misalignment of the pattern for package molding. Thus, even if the separation distance 67 between dambar 60 and edge 68 is changed for a different package configuration, the dimensions of slugs 58 will be such as to maintain a nominal tolerance from package edge 68.

In a high lead density package, that is a package having a relatively large number of leads, it is necessary to make the leads a slightly reduced size while forming the leadframe. This size reduction is required because there is some deformation of the leadframe material in the process of partially stamping and counter-punching the slugs, which deformation results in a slight expansion of the leadframe. For this reason, the lead pattern shown in FIG. 2 is stamped slightly smaller than nominal dimension to compensate for this spreading. For example, in a small outline package having adjacent leads separated 50 mils (lead center to center), there is about a 0.2 mil growth in each direction on each lead. This approximately 0.5% growth is compensated for by stamping the After slug formation, the leadframe dimensions will be nominal and the final package will fit in a socket or on a printed circuit board having nominal dimensions.

FIG. 3A is an enlarged plan view of a portion of FIG. 2. With reference to FIG. 3A, a slug 58 is located between adjacent leads 56, dambar 60 and a distance 57 from the edge 68 of the package to be formed. FIG. 3B is a side view of section A—A in FIG. 3A after an initial stamping of the slug 58. As seen in FIG. 3B, slug 58 extends downward a distance 70 from the plane of leadframe 54, distance 70 being approximately 75% of the thickness 72 of leadframe 54. In a preferred embodiment, slug 58 is partially stamped distance 70 through leadframe 54 by a punch head 100 (see FIG. 4A) using a conventional high speed progression leadframe stamping die (not shown). Of course, slug 58 may be urged down by other means as well. With reference to FIG. 3B, the upper-most surface of leadframe 54 is denoted the non-burr surface (i.e., the surface from which slug 58 was urged downward), while the bottom-most surface of leadframe 54 is denoted the burr surface (the surface toward which slug 58 was urged).

FIG. 3C shows the slug 58 after it has been urged or pushed upward substantially back into the plane of leadframe 54 by a return punch 102 (see FIG. 4B), or other urging means. At this stage the slug is disposed essentially within the same plane as the leadframe.

FIG. 4A illustrates the punching process according to a preferred embodiment whereby slug 58 is pushed downward a distance 70 by a punch head 100. FIG. 4B shows slug 58 being pushed back into the plane of leadframe 54 by a return punch head 102. As shown in FIG. 4C, even after step 4B has been completed, slug 58 may still be out of the plane of leadframe 54 a small distance, typically about 0.5 mil. Preferably distance 70 is such as to cause the material of leadframe 54 to begin tearing to facilitate later removal after encapsulation.

In another embodiment a tapered punch is used to partially stamp a substantial portion of the slug about 75% through the leadframe material, while stamping the portion of the slug adjacent the dambar only about 25% of the way through the leadframe material. Slugs so produced are slightly harder to punch away from the leadframe material than slugs produced according to the preferred method. Slugs formed with a tapered punch are desirable for package configurations where slugs produced according to the preferred method are too easily removed or fall out before the encapsulation process is complete. The subsequent steps in manufacture remain as described herein.

FIG. 5 shows the assembly of FIG. 2 after encapsulation. Body 62 has been formed by molding an encapsulant about the upper and lower surfaces of the leadframe 54, totally covering the integrated circuit chip 52. As shown in FIG. 5, flash 59 flows essentially no further than the closest portion of scored slugs 58 to package edge 68, a nominal distance of 3 mils. Any flash 59 bleeding onto slugs 58 will be very thin, almost transparent, and can be readily removed during deflash operation. Although FIG. 5 is drawn with flash 59 extending from both sides of package 62, it is to be understood that under worst case conditions, there could be twice the flash extending from one edge of package 62, with substantially no flash extending from the other edge.

Referring now to FIG. 6, a magnified view of a portion of FIG. 5 is shown wherein deflash punch heads 110 have diagonal shading. Punch heads 110 are shown covering dambar 60, and the majority of each of the slugs 58. The only portion of slugs 58 not covered by heads 100 is a portion extending out a distance 112 from the package edge 68, which in the preferred embodiment is about 5 mils.

Punch heads 110 simultaneously cut dambar 60 and remove slugs 58 and any flash 59 that may have bled onto slugs 58. In a preferred method, deflash punching is performed from the direction of the burr side of the leadframe 54 towards the non-burr side. Deflash in this direction removes flash that bled onto slugs 58 more cleanly than deflash in the opposite direction. Less flash bleeds onto the burr-side of the leadframe because the burr edges are approximately vertical to plastic flow and act to halt flash flow. As a practical matter, it is efficient to invert the leadframe during deflash so any bled-on flash falls downward and away as the deflash punch travels from the burr side to the non-burr side of the leadframe.

The completed integrated circuit package produced according to the present method is similar in appearance to prior art packages, except that the residual flash protruding from the finished package is reduced in the preferred embodiment from a nominal 10 mils to a nominal 3 mils. As a result the package is compatible with all present integrated circuit applications. The package is produced more rapidly than the prior art packages because the dambar and slugs may be removed simultaneously with little wear on the punch head. Further, there is less likelihood of fracturing the encapsulated package during deflash because the slugs are so readily removed. The invention provides a method of forming leadframes and encapsulating integrated circuit packages, where the projecting residual flash is much smaller than prior art. The present invention produces an encapsulated package using existing equipment operating at a production rate at least as fast as used to produce encapsulated packages in the conventional manner.

Variations may be made to the disclosed embodiment without departing from the scope of the invention as defined by the following claims. For instance, the temporary slugs could be formed by urging in a first direction and then in a counter direction by means other than a punch, or the slugs could be created by scoring with a cutting edge, laser or other cutting system. Although an embodiment showing a dual in-line package configuration has been described, the method of the present invention is equally applicable to packages designed to be surface mounted, or packages having leads extending from all sides.

We claim:

1. A process for producing a leadframe used for mounting and then encapsulating an integrated circuit in a molded package having an edge, the leadframe having a first and second surface and a thickness therebetween, leads, and a dambar separated from the package edge, comprising the steps of:

partially stamping a slug from the first surface a fraction of the thickness of the leadframe toward the second surface leaving the slug attached to the leadframe, the slug having a side nearest to said package edge, the slug at said nearest side remaining attached to the leadframe after said stamping;

pushing said slug from the second surface toward the first surface until the slug is substantially flush with the leadframe without detaching the slug from the leadframe, to form a scored area surrounding said slug, except on said nearest side, the slug remaining attached weakly to the leadframe; and forming a first distance between said nearest side and a point where the package edge will be molded, the slug being bounded by adjacent leads on the leadframe and the dambar.

2. A process as in claim 1 wherein the first distance is about 3 mils.

3. A process as in claim 1 further comprising the steps of:

encapsulating the integrated circuit in a molded package; and removing the dambar and the slug.

4. A process for producing a leadframe for mounting and encapsulating an integrated circuit in a molded package having an edge, the leadframe having first and second surfaces and a thickness therebetween, leads, and a dambar separated from the package edge, comprising forming a removably attached slug bounded by adjacent leads on the leadframe and the dambar, the slug being disposed between where the package edge will be molded and the dambar, wherein the steps of forming includes the steps of:

urging the slug from the first surface a fraction of the thickness of the leadframe toward the surface, leaving the slug attached to the leadframe, the slug having a side nearest to said package edge, the slug at said nearest side remaining attached to the leadframe after said urging; and urging the slug from the second surface towards the first surface until the slug is substantially flush with the leadframe, leaving said slug attached weakly to the leadframe through a scored area.

5. A process as in claim 4 wherein the fraction of the thickness is about 75%.

6. A process as in claim 4 wherein the step of urging the slug from the first surface is performed with a first punch head.

7. A process as in claim 5 wherein the step of urging the slug from the second surface is performed with a second punch head.

* * * * *